(12) United States Patent
Gunapala et al.

(10) Patent No.: US 6,211,529 B1
(45) Date of Patent: Apr. 3, 2001

(54) INFRARED RADIATION-DETECTING DEVICE

(75) Inventors: Sarath Gunapala, Valencia; John K. Liu, Pasadena; Jin S. Park, Cerritos; True-Lon Lin, Cupertino; Mani Sundaram, Pasadena, all of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 08/785,350

(22) Filed: Jan. 17, 1997

Related U.S. Application Data

(63) Continuation-in-part of application No. 08/708,076, filed on Aug. 27, 1996, now abandoned.

(51) Int. Cl.[7] .................. H01L 29/06; H01L 31/0328; H01L 31/0336

(52) U.S. Cl. .................. 257/17; 257/21; 257/22; 257/184; 257/185; 438/57; 438/73; 438/74; 438/77

(58) Field of Search .................. 257/21, 184, 17, 257/22, 185; 438/57, 73, 74, 77, 93, 94

(56) References Cited

U.S. PATENT DOCUMENTS

| | | | |
|---|---|---|---|
| 4,620,214 | * 10/1986 | Margalit et al. | 257/21 |
| 4,894,526 | 1/1990 | Bethea et al. | 250/211 R |
| 4,903,101 | * 2/1990 | Maserjian | 257/21 |
| 5,023,685 | 6/1991 | Bethea et al. | 357/30 |
| 5,077,593 | * 12/1991 | Sato et al. | 257/21 |
| 5,128,728 | * 7/1992 | Liu | 257/15 X |
| 5,198,682 | * 3/1993 | Wu et al. | 257/21 |
| 5,384,469 | * 1/1995 | Choi | 257/21 |

OTHER PUBLICATIONS

Steele et al., "Importance of the Upper State Position in the Performance of Quantum Well Intersubband Infrared Detectors," *Appl. Phys. Lett.* 59 (27), Dec. 30, 1991, pp. 3625–3627.*

Gunapala, et al., "Recent Developments in Quantum–Well Infrared Photodetectors", Oct. 1995, *Thin Films*, vol. 21, pp. 113–237.

Gunapala, et al., "9$\mu$m Cutoff 256x256 GaAs/Al$_x$Ga$_{1-x}$As Quantum, Well Infrared Photodetector Focal Plane Array Camera", Submitted to *IEEE Transactions on Electron Devices*, Oct. 1995.

* cited by examiner

*Primary Examiner*—William Mintel
(74) *Attorney, Agent, or Firm*—Fish & Richardson P.C.

(57) ABSTRACT

An Al$_x$Ga$_{1-x}$As/GaAs/Al$_x$Ga$_{1-x}$As quantum well exhibiting a bound-to-quasibound intersubband absorptive transition is described. The bound-to-quasibound transition exists when the first excited state has the same energy as the "top" (i.e., the upper-most energy barrier) of the quantum well. The energy barrier for thermionic emission is thus equal to the energy required for intersubband absorption. Increasing the energy barrier in this way reduces dark current. The amount of photocurrent generated by the quantum well is maintained at a high level.

32 Claims, 14 Drawing Sheets

INFRARED RADIATION-DETECTING DEVICE

This is a continuation in part of U.S. application Ser. No. 08/708,076, filed Aug. 27, 1996, now abandoned.

ORIGIN OF THE INVENTION

The invention described herein was made in the performance of work under a NASA contract, and is subject to the provisions of Public Law 96-517 (35 USC 202) in which the Contractor has elected to retain title.

FIELD OF THE INVENTION

This invention relates to quantum-well devices for detecting infrared ("IR") electromagnetic radiation.

BACKGROUND AND SUMMARY

Objects emit infrared radiation according to their temperature. An object at room temperature (i.e., 300° K.), for example, emits infrared radiation that has a peak at around 8.5 μm. Even in complete darkness, i.e., in the absence of visible optical wavelengths, the infrared radiation emitted from the object can be detected. That detected radiation can be processed with an infrared-radiation detector to generate an image.

Infrared radiation detectors operating in the range of 8–15 μm have been used in night vision, navigation, flight control, weather monitoring, security, surveillance, and chemical detection. The earth's atmosphere is transparent to 8–12 μm radiation, and infrared-radiation detectors operating in this range are thus used in telescopes, communication systems, and in defense. IR scanner data has also been used to map sulfur dioxide fumes from quiescent volcanos.

The early IR detectors were intrinsic detectors. An intrinsic photodetector takes advantage of optical radiation's capability of exciting a photocarrier, e.g., an electron. Such a photo-excited electron or "photoelectron" is promoted across the band gap from the valence band to the conduction band and collected. The collection of these photoelectrons produces a flow of electrons, which is detected as a current.

An intrinsic photodetector requires that an incoming photon from the radiation to be sensed is sufficiently energetic to promote an electron from the valence band to the conduction band. Hence, the energy of the photon =hv needs to be higher than the band gap $E_g$ of the photosensitive material.

Quantum well detectors are more sensitive. Quantum well photodetectors can be used to form quantum well infrared photodetectors ("QWIPs")that are sensitive to 6–25 μm infrared radiation. A quantum well is formed by packaging a relatively thin layer of a first semiconductor (typically GaAs) between adjacent layers of a second semiconductor (typically $Al_xGa_{1-x}As$). These semiconductor materials have a gap of inherent energies, "a band gap", between them. The materials are used to form an energy "well" in the semiconductor. That well can capture photons generated by the incoming radiation. The electrons are promoted by the photon from a ground state within the well to an excited state.

Spectral response of the detectors has been adjusted by controlling the band gap. However, detection of long wavelength radiation, such as infrared radiation, requires a small band gap; e.g., around 62 meV. These low band gap materials are characterized by weak bonding and low melting points.

The art responded by forming multi-quantum well structures (MQW) made of large band gap semiconductors. Positions of the energy levels in an MQW structure are primarily determined by the well height and width. For example, the energy level separation and the depth of the quantum well are increased as the thickness of the GaAs layer is decreased. The well's height also depends on the band gap of the $Al_xGa_{1-x}As$ layer and the relative proportions of Al and Ga ("x") in the $Al_xGa_{1-x}As$. The intersubband energy, i.e., the energy between the ground state $E_1$ and the first excited state, defines many of the essential characteristics of the quantum well.

Quantum well infrared photodetectors operate based on photoexcitation of an electron between ground and a first excited state in the quantum well. The basic operation of a single well is shown in FIG. 1.

The band gap 110 of the $Al_xGa_{1-x}As$ 112 is different from the band gap 120 between the GaAs layers 122. This difference forms the well which captures the electrons. These photoelectrons can escape from the well and are collected as photocurrent.

The band gap of $Al_xGa_{1-x}As$ can be changed by varying x. This hence changes the height of the well and allows changing the energy required to capture an electron, the "intersubband transition energy."

An intrinsic infrared photodetector, as described above, increases the energy of an electron using one (or many) photons, and detects the resultant photoelectrons. The photon needs to be sufficiently energetic to increase the energy of the electron sufficiently to promote the electron from the valence band 130 to the conduction band 132. This has been called interband operation, signifying the electron's promotion from one band to another band.

The intersubband system shown in FIG. 1 promotes the electrons between subbands—here from one subband 101 to another subband 106. Intersubband transitions operate between confined energy states, i.e., quantum wells associated with either the conduction band 132 or valence band 130 in the quantum well. The promotion is effective at holes 100 in the quantum well.

Different kinds of intersubband transitions exist. A bound-to-bound transition is formed when both the ground state 104, and the excited state 106 of the excited electrons are bound within a quantum well 100.

A multi-quantum well system is schematically shown in FIG. 2. Like the FIG. 1 system, the quantum wells generate photocurrent following intersubband absorption between two bound energy levels. A bound-to-bound intersubband absorption requires the infrared wavelengths to excite an electron from the ground state 220a to a bound excited state 222 within the well. The electron then tunnels through the edge of the well via quantum tunneling shown as 230, to an unbound and continuous level above the well level, "the continuum level" 210. The bias on the well excites a flow of electrons through the continuum. This flow of electrons is detected as photocurrent.

The sensitivity of the detector is a function of efficiency of the photocurrent detection, i.e., the amount of detected photocurrent sensitivity is degraded by noise in the detector. Since infrared radiation has less energy than higher frequency electromagnetic radiation such as visible electromagnetic radiation, the system generates relatively less photocurrent. This has provided a unique challenge to enhancing detector efficiency.

Dark current is a source of noise in QWIPs. Dark current is, as the name implies, current that flows in the dark, i.e., even when radiation to be detected is not reaching the QWIP. The dark current in a QWIP originates from three main mechanisms, quantum mechanical tunneling, thermally assisted tunneling and thermionic emissions.

Quantum mechanical tunneling from well to well through the barriers (shown as 224), also called sequential tunneling, occurs independent of temperature. This occurs to a very small extent, and dominates the dark current at very low temperatures.

Thermally-assisted tunneling 226 is based on thermally excited quantum tunneling through the tip of the barrier into the continuum 210. At medium temperatures, e.g., around 45° K. for an 8–9 µm detector, thermally-assisted tunneling governs the dark current.

At the more usual high temperatures, greater than 45° K., classical thermionic emissions 228 dominate the dark current. A thermionic emission occurs when the electrons are promoted by thermionic processes, i.e. without an incoming photon.

It is highly desirable to reduce the dark current to make a more sensitive detector, i.e., a detector with higher signal to noise ratio. However, it is also desirable that the detector produce as much photocurrent as possible.

The bound-to-bound system requires a photoexcitation energy, $E_P$ 240 in order to excite it from one state to another. This energy $E_P$ is less than the energy for thermionic emission $E_P$ 242. Since the bound level $E_P$ is within the quantum well, thermionic emission is only caused by those electrons which are sufficiently energetic to escape from that bound level to the continuum 210. The dark current contribution from $E_D$ is hence relatively small.

However, since the excited bound level is within the quantum well, the photoexcited electrons escape from the well by quantum mechanical tunneling shown as 230. The resistance against particle tunneling is inversely and exponentially proportional to the distance through which a particle needs to tunnel. The number of particles which will tunnel through a barrier is inversely exponentially proportional to the thickness of that barrier. Most particles will easily tunnel through a barrier that is less than 50 Å in thickness. However, only some particles will tunnel through a barrier between 50 and 100 Å, and any barrier greater than 100 Å in thickness presents a formidable challenge for tunneling. The tunneling for a bound-to-bound transition has typically more than 100 Å, and hence many of the electrons do not tunnel in this way. Therefore, while the dark current in the bound-to-bound photodetectors is low, the photocurrent has also been low because of the.

Signal to noise ratio in these detectors can be modeled as:

$$S/N \propto \frac{I_P}{\sqrt{I_D}}$$

Where $I_D$ is the dark current. Both the dark current $I_D$ and the photocurrent $I_P$ are lowered in the bound to bound system.

The level of the bound particles in QWIPs are dependent on characteristics of the QWIP materials. One prior art attempt to increase signal to noise ratio involved reducing the thickness of the GaAs layer in the FIG. 1 system to thereby elevate the excited state energy level into the continuum level. This intersubband configuration has been called "bound-to-continuum." The photoelectrons are bound into the continuum level, so the photoexcited electrons can escape from the quantum well to the continuum transport without tunneling as shown by 254 in FIG. 2. Hence more of the photoelectrons can escape as photocurrent, increasing the signal S. However, since the $E_P$ 250 for this detector is less than the $E_D$ 252, the electrons are very energetic. This configuration hence has a very low barrier against dark current through thermionic emission. The energy barrier for thermionic emission ($E_T$) is ten to fifteen meV smaller than the energy required for the intersubband photoionization process. Accordingly, this configuration has higher noise N relative to the bound-to-bound system.

A special form of intersubband absorption is described in this specification which increases the signal S while avoiding or minimizing increase in noise. An absorption subband is described which occurs when the first excited state is in resonance with an area near the top of the barrier. The inventors have titled this a "bound-to-quasibound" transition. Such transitions exist when the thermionic emission energy barrier of the quantum well ($E_T$) is substantially matched to the energy required for photoionization ($E_P$), i.e., preferably within 2% of precise resonance.

This bound-to-quasibound configuration has a thermionic emission energy barrier which is increased relative to the bound-to-continuum transitions. More thermal energy is required to liberate an electron confined in the quantum well. Dark current generated by the quantum well during operation is therefore reduced. However, since the excited state in the bound-to-quasibound configuration is resonant with the thermionic emission energy barrier, electrons can escape with little or no tunneling. The quantum wells with this configuration hence maintain a high quantum efficiency, i.e., a large amount of photocurrent is generated by the incident infrared photons.

These two factors—low dark current and high quantum efficiency—increase the signal-to-noise ratio of the photocurrent generated by the quantum well.

It is hence an object to increase the energy barrier for thermionic emission relative to bound-to-continuum structures. One aspect of the present invention carries out this object by forming bound-to-quasibound quantum wells which exhibit increased sensitivity and improved dynamic range.

The quantum's depth and thickness of the quantum well are modified so that the first excited state is resonant with (i.e., has substantially the same energy as) a portion of the "bottom" (i.e., the lower energy barrier) of the quantum well. The energy barrier for thermionic emission is thus substantially equal to the energy required for intersubband absorption. Increasing the energy barrier in this way significantly reduces dark current while the photocurrent generated by the quantum well is maintained at a high level.

Bound-to-quasibound QWIPs exhibit peak sensitivities at a value that is based on the material thicknesses. An exemplary value is 8.5 µm at 70° K. However, this value can be changed by appropriate adjustment of the well width $L_W$ and the barrier height $E_G$.

A single QWIP includes a quantum well structure with about 50 quantum wells. Each well preferably includes a 40–70 Å thick GaAs between two 300 Å-500 Å $Al_xGa_{1-x}As$ barrier layers. The mole fraction (x) of Al is preferably 0.3. Each quantum well is preferably doped with a density of n-type carriers (typically $5\times10^{17}$ cm$^{-3}$) to lower the Fermi energy of the carriers and further reduce dark current.

The QWIP quantum well structure of the preferred embodiment is formed between silicon-doped GaAs electrical contact layers. These layers are attached to electrical leads which supply an electrical bias which facilitates collection of photocurrent. All layers are preferably formed on a GaAs substrate.

The QWIP primarily absorbs radiation having a polarization component along the growth axis (i.e., thickness) of the quantum well. The QWIP thus preferably includes a randomly reflecting surface (e.g., gold) patterned on the top electrical contact layer. Radiation passes into and through the bottom of the QWIP and irradiates the reflecting surface. Internal reflections within the quantum well structure adjust angles of the radiation relative to the growth axis to facilitate optical absorption. The number of internal reflections is maximized by making the GaAs substrate as thin as possible.

QWIPs accordingly to the embodiment are preferably patterned on the GaAs substrate in a 256×256 pixel array although other sizes are contemplated. This structure is preferably incorporated in a QWIP/silicon CMOS multiplexer hybrid detector used for generating two-dimensional infrared images.

QWIP pixel arrays are formed by first growing a stop-etch layer and an electrical contact layer on a 3-inch GaAs wafer. This area is called the "bottom" of the structure. The quantum well structure is formed by growing alternating $Al_xGa_{1-x}As$ barrier and GaAs well layers on top of the electrical contact layer. A final electrical contact layer is then grown on top of the quantum well structure.

Each layer is grown by molecular beam epitaxy (MBE). Multiple QWIP arrays are then patterned using standard photolithography and chemical etching techniques. The GaAs wafer is then diced to form individual GaAs substrates, each containing a single focal plane array.

The system of the present invention is often used in special cameras and systems. The focal plane array described in this specification is often used as a hybrid along with its CMOS support circuitry. This produces its own special host of problems.

A single GaAs focal plane array is attached to the CMOS multiplexer pixel array and "thinned" substantially down to the stop-etch layer. A special photolithographic thinning process which reduces the aspect ratio (i.e., the ratio of thickness to width) of the QWIP array is described. Thinning the substrate improves optical coupling, minimizes thermal mismatch between GaAs and CMOS logic families, and minimizes optical crosstalk between adjacent pixels.

The thinning process includes an abrasive polishing step for removing the first 500 μm of the substrate. A chemical polishing step (using a bromine:methanol mixture at a ratio of 1:100) is then used to remove the next 100 μm of substrate. Outer surfaces of the QWIP photodetector except for the GaAs substrate surface are then covered with a standard photoresist. A wet chemical etching step using a $H_2SO_4$:$H_2O_2$:$H_2O$ solution (5:40:100) removes the next 20 μm from the substrate. The etching process is continued until about 5 μm of the GaAs substrate remains. The detector is then loaded into a plasma etching chamber evacuated to a pressure of less than $1\times10^{-6}$ torr. $CCl_2F_2$ flows in the presence of a radio frequency ("RF") to form a plasma in the chamber to etch the substrate until the stop-etch layer is reached. The thinned QWIP pixel array attached to the CMOS multiplexer pixel array is then processed with a final cleaning step and removed from the chamber.

Bound-to-quasibound QWIPs exhibit relatively low amounts of dark current due to their increased energy barriers for thermionic emission. Lowering the dark current increases the sensitivity and dynamic range of the QWIP. The first excited state of the bound-to-quasibound QWIP is resonant with the top of the well. This configuration maintains the quantum efficiency, of the QWIPs (i.e., the number of photocarriers generated for each incident photon) and sensitivity at a high level.

QWIPs according to the techniques described in this specification can be used to form a photodetector having high-quality images, having high signal-to-noise ratios.

BRIEF DESCRIPTION OF THE DRAWINGS

These and other aspects of the present invention will now be described in detail with reference to the accompanying drawings, in which.

DETAILED DESCRIPTION

Figure 3A:
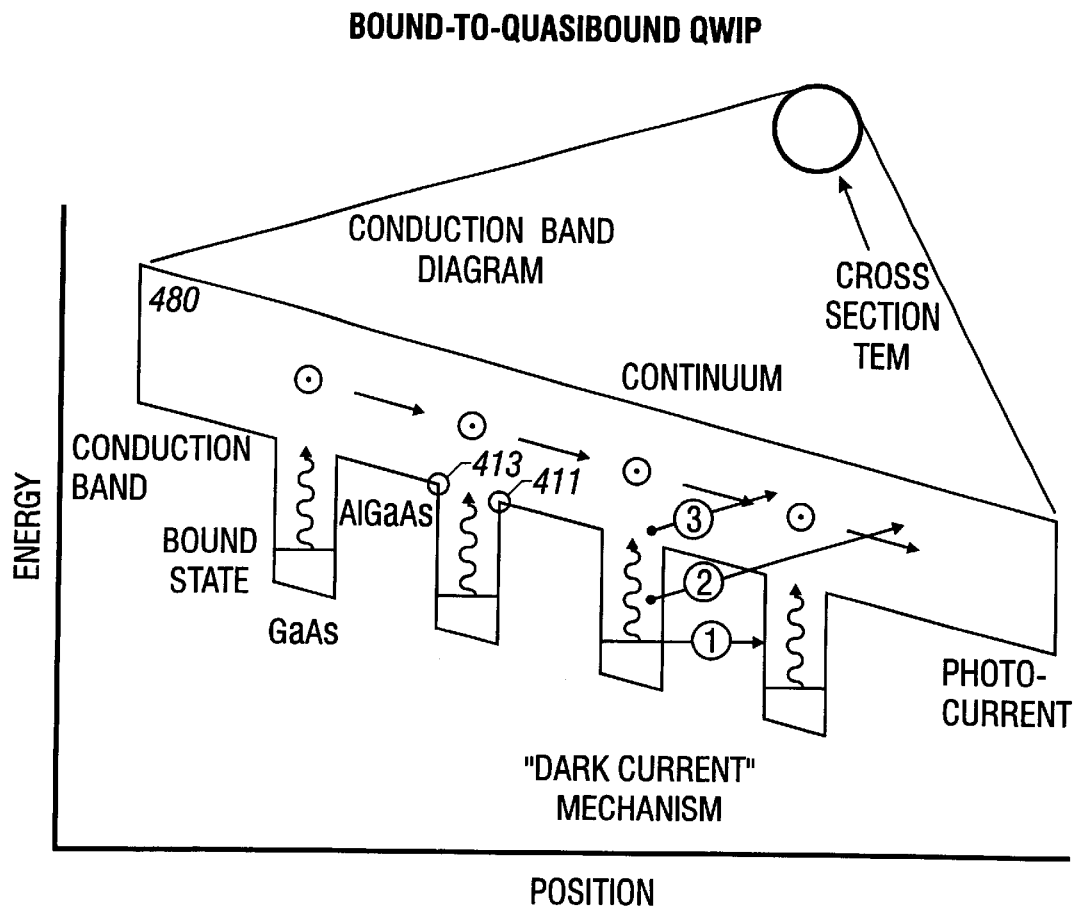
FIG. 3A depicts the energies of particles in a quantum well for a device of an embodiment of the present invention.
Figure 3B:
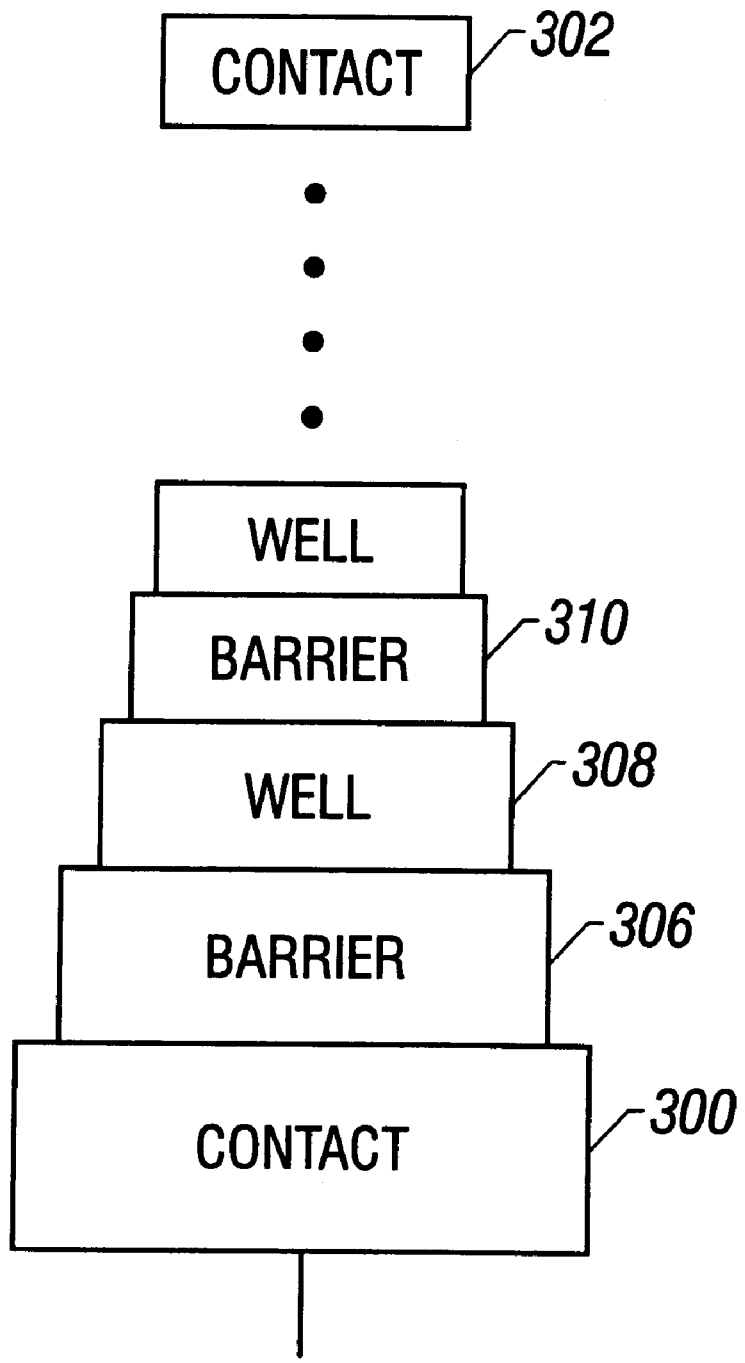
FIG. 3B shows the layers forming the QWIP of one embodiment of the present invention.

FIG. 3A shows the structure of the preferred bound-to-quasibound QWIP of this embodiment and FIG. 3B shows the layers forming the device. Bottom contact layer 300 and top contact layer 302 form the two ends of the QWIP. Each of these contact layers is preferably a silicon doped element with doping of $N_d=1\times10^{18}$ cm$^{-3}$. The contact layers 300 and 302 are between one half micron and one micron in thickness. The contact layers are separated by 50 periods of well materials. Each period includes 300–500 Å thick $Al_xGa_{1-x}As$ barriers 306, 310, preferably 500 Å; where x is approximately equal to 0.10–0.40; preferably 0.3. Each period also includes GaAs quantum wells 308 of 45 to 80 Å; preferably 50 Å.

Figure 4:
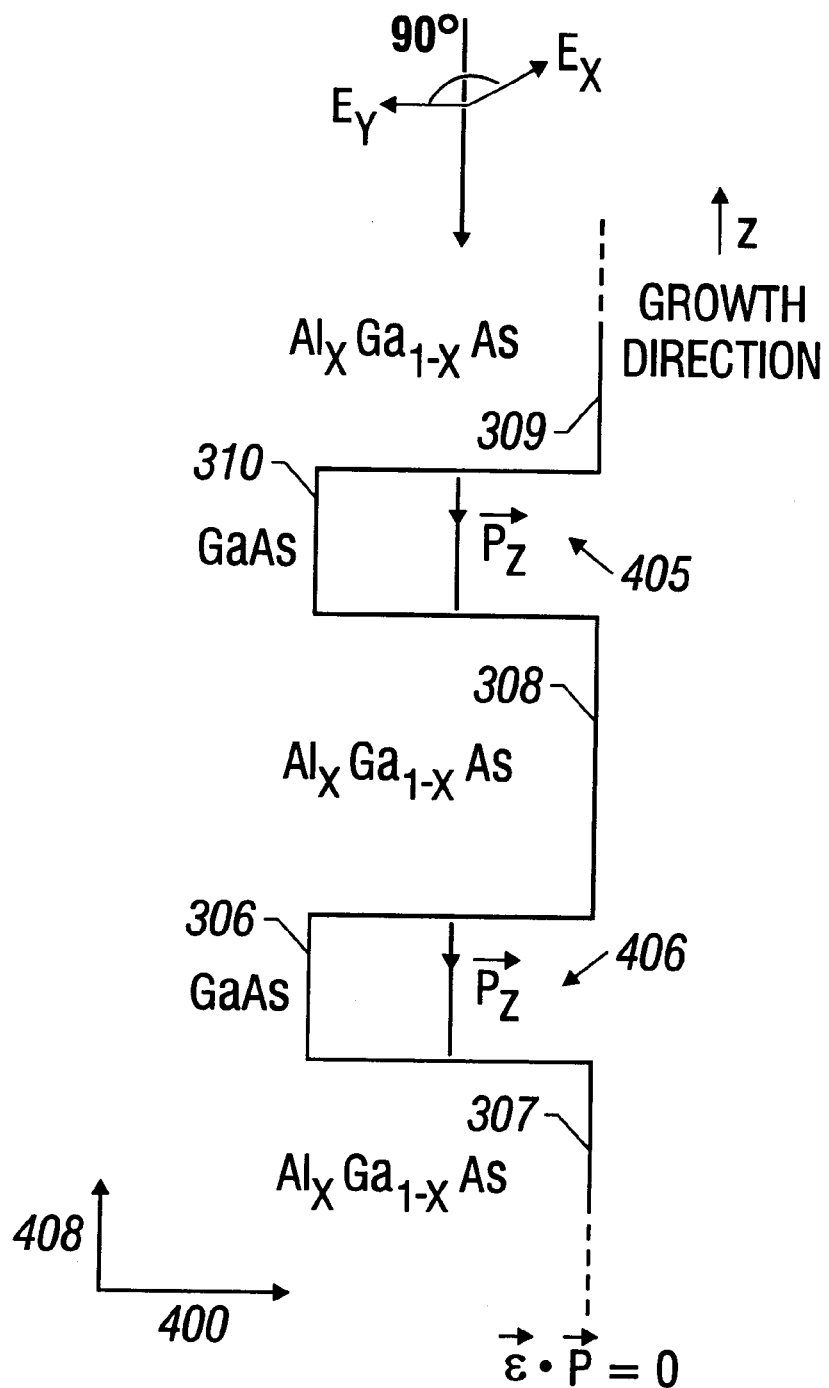
FIG. 4 shows a relationship between the quantum wells, the energy and the incoming radiation.

The photocarriers will be assumed throughout this specification to be formed by electrons. The un-excited electron is at ground state 450, and can be excited to excited state 452. The resulting energy level is shown in FIG. 4, where the horizontal axis 400 of the diagram indicates energy; the vertical axis 402 is a spatial dimension along the growth axis z (i.e., the thickness) of the quantum well.

Quantum wells 406, 408 are formed as thin well layers of GaAs, 306, 310, between the two neighboring barrier layers of $Al_xGa_{1-x}As$ 307, 308, 309. The GaAs thickness forms the well width. Each quantum well 406, 408 is shown with a square shape based on the band gap of the $Al_xGa_{1-x}As$ barrier layers being larger than that of the GaAs well layer. The band gap of $Al_xGa_{1-x}As$, and thus the well depth, is precisely controlled by varying the Al mole fraction (x). The thicknesses of the GaAs 306 and $Al_xGa_{1-x}As$ 307, 308, 309 layers determine, respectively, the width of the quantum wells and the spatial distance between wells. Preferably the material forming the wells 406, 408 is an order of magnitude thinner than the material forming the barrier 308.

The bound-to-quasibound energy-level configuration of the quantum wells 406, 408 is obtained by controlling the properties and quantities of the GaAs and $Al_xGa_{1-x}As$ materials to effect the necessary resonance relationship. The mole fraction of Al can be increased to increase the well depth 30. The thickness of the GaAs well layer can be decreased to increase the separation between the ground 20 and excited state 24 and the well depth 30. The preferred bound-to-quasibound configuration results when the photo-ionization ($E_P$) is substantially equal to the thermionic emission energy barrier. At this time, as shown in FIG. 3A, the excited state 452 of the electron is substantially resonant with the bottom portion 471 of the well top. The excited state lies slightly below the continuum of higher energy excited states.

Another preferred embodiment uses GaAs well layers which are 45 Å thick surrounded by $Al_xGa_{1-x}As$ barrier layers which are 500 Å thick. The mole fraction of Al (x) in the barrier layer is preferably 0.29.

FIG. 3A shows an energy level diagram of multiple bound-to-quasibound quantum wells biased with an applied voltage. The bias voltage skews the shape of the energy levels so that photocurrent formed by the photoelectron 210 flows energetically "downhill" from the top 480 of the QWIP to the bottom 482. This skewed well has a top edge 473, and a lower energy bottom edge 471. During operation, infrared radiation (indicated by the arrows 460) produce an energy (hc/λ) which is close to being resonant with the energy level of the lower edge 471. This energy promotes a confined electron to the excited state 452. This process generates the photoelectrons 462 which flow as photocurrent when the quantum well is biased. A photon with a non-resonant wavelength is not absorbed by the quantum well, and does not generate photocurrent.

The excited state is considered to be substantially resonant when it brings the photoelectron to within 2–5% of the bottom edge 471, preferably within 2% and more preferably within 2–3 meV of the edge. Most preferably the photoelectron is precisely at the edge 471, or lower than the edge by the small amount described above. This allows the photoelectron to escape to the continuum with no tunneling (if at the edge 471) or with minimal tunneling through only a small part, within 2–3 meV of the well. The amount of tunneling is less than 80 Å, more preferably less than 50 Å, and even more preferably 38 Å or less. This provides a minimal barrier against collection since the tunneling difficulty increases exponentially with barrier thickness.

Figure 5:
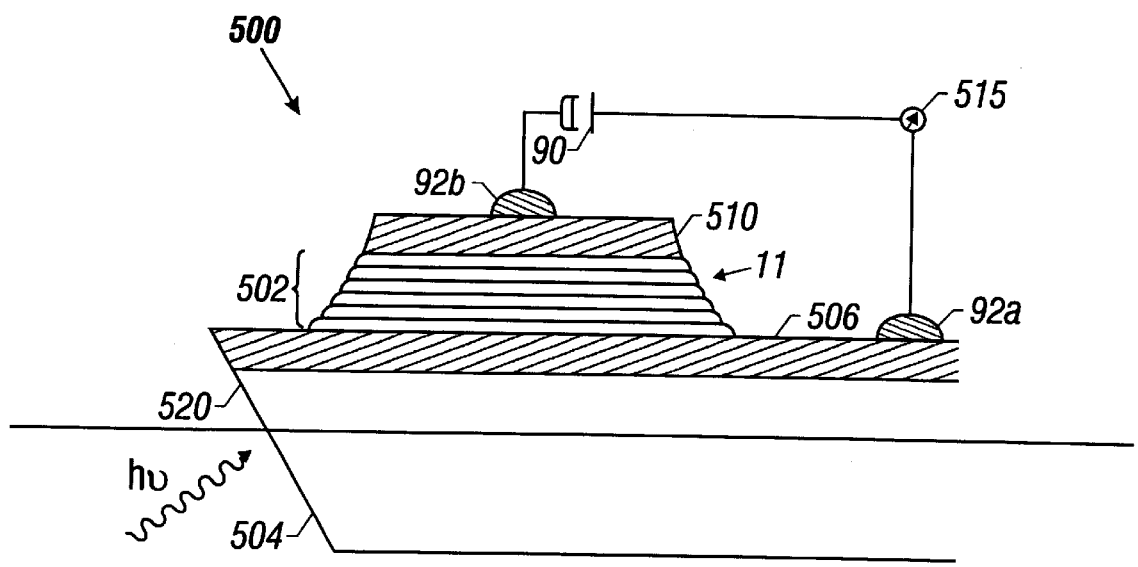
FIG. 5 shows a cross-sectional view of a detector or a single pixel.

FIG. 5 shows a quantum well infrared photodetector 500. Quantum well structure 502 is formed using the structure of FIGS. 3A and 3B, with each quantum well having a well layer of GaAs formed between $Al_xGa_{1-x}As$ layers. The quantum well structure 502 includes multiple quantum wells 11, each exhibiting the bound-to-quasibound intersubband transitions. All layers are grown on a semi-insulating GaAs substrate 504. A bottom electrical contact layer 506 is disposed between the GaAs substrate 504 and the quantum well structure 502. A top electrical contact layer 510 lies on top of the quantum well structure 502.

The contact layers 506, 510 are doped with n-type charge carriers to facilitate generation of photocurrent during operation. A voltage source 90 is connected to the contact layers 506, 510 via leads 92a, 92b and used to bias each quantum well 11 in the quantum well structure 82. Radiation-induced photocurrent is recorded with a current-measuring instrument 515.

The number of quantum wells within the quantum well structure 502 is selected to maximize optical absorption and also the amount of generated photocurrent taking into account a desired photoconductive gain. The optimum number of quantum wells within the structure is preferably around 50. This number represents a tradeoff between the distance that a photoelectron generated in one well of the structure can traverse through the continuum without being captured downstream by a separate well, and optical gain.

Reducing the number of quantum wells from 50 results in lower optical absorption but a higher relative fraction of the generated photoelectrons being collected. This also affects the optical gain of the device, and hence the noise. An optical gain of 1 represents that each photoelectron, statistically, travels the entire distance from its well to collection without being recaptured. Higher optical gains have higher dark current, however. The inventors prefer an optical gain of 0.1, which means that 10% of the particles go from well to collection without recapture. When the photoconductive gain is low, the noise in the detector can be somewhat reduced.

Figure 1:
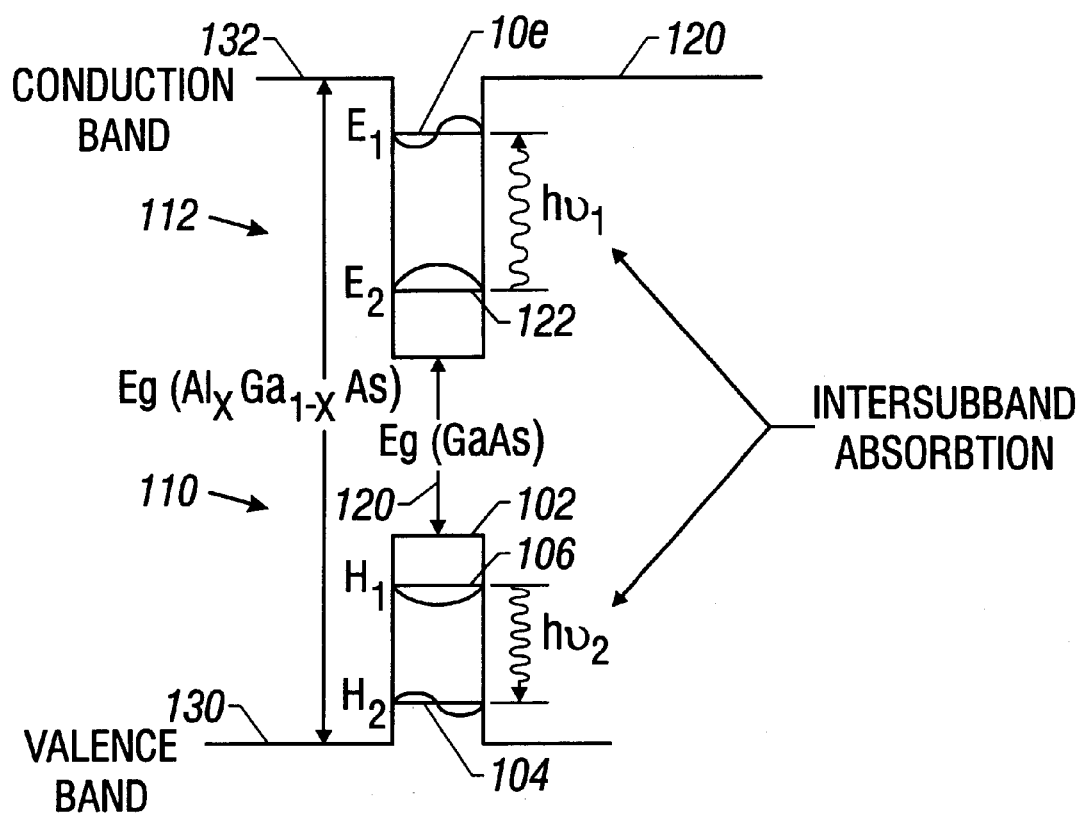
FIG. 1 shows a diagram of a single quantum well.
Figure 2:
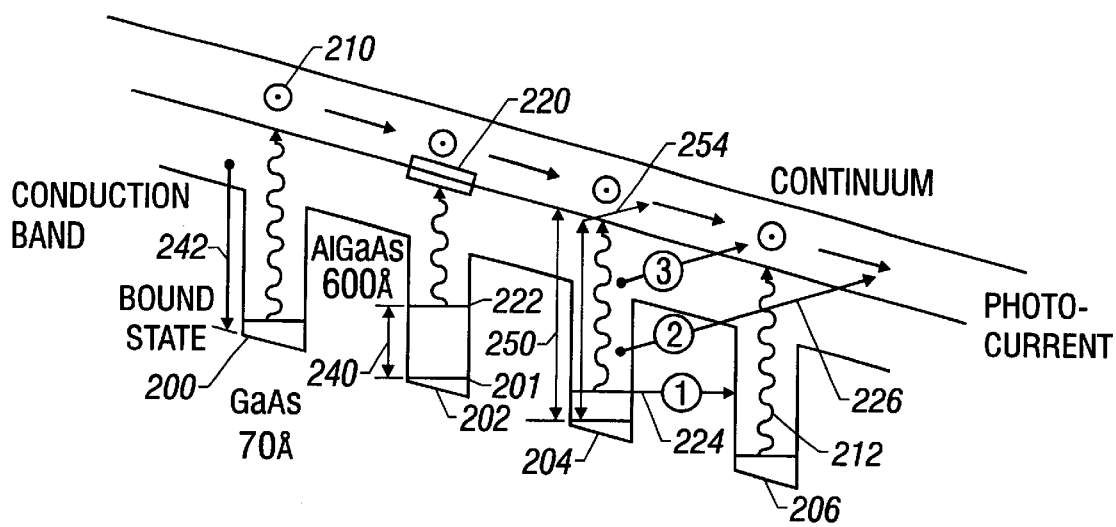
FIG. 2 depicts the energies of particles in a quantum well, and the energy areas of that quantum well biased with an electric field for the bound-to-bound and bound-to-quasibound detectors.

The quantum well structure 502 may otherwise have the same physical dimensions as described for FIG. 1. Contact layers 506, 510 on each side of the well structure have thicknesses of, respectively, 1.0 and 0.5 microns. Both contact layers are doped with silicon at a concentration of $N_D=1\times10^{18}$ cm$^{-3}$. GaAs and $Al_xGa_{1-x}As$ layers within the quantum well structure are doped to $N_D=5\times10^{17}$ cm$^{-3}$ to lower the Fermi energy of the electrons in the quantum well.

As described above, quantum wells usually do not absorb radiation incident normal to their surface; the radiation must have an electric field polarization along the quantum well growth axis (z) to be absorbed. The GaAs substrate 504 therefore includes a 450 polished facet 520 which is angled relative to the z axis. Optical absorption is enhanced when radiation passes through the polished facet 520 and enters the quantum well structure at an angle relative to the z axis. The radiation is then absorbed to generate a photocurrent.

Other mechanisms are also used for adjusting the angle of the incident radiation relative to the z axis. A random, roughened reflecting surface can be patterned on the bottom surface of the bottom electrical contact layer or top of the top electrical contact on the surface layer. Highly reflective materials (e.g., gold or silver) are preferably used for the random reflectors. In this configuration, radiation that is normal to the top surface of the QWIP passes through the quantum well structure and irradiates the roughened, reflecting surface. Subsequent internal reflections within the quantum well structure are angled relative to the growth axis (z). The internally-reflected radiation is absorbed by the quantum well structure to generate photoelectrons.

Radiation within a small cone (typically 17° from normal) is outside of the critical angle required for internal reflection. Radiation in this cone thus escapes through the top surface of the QWIP. The total number of internal reflections (and thus the number of photoelectrons) is maximized by making the GaAs substrate as thin as possible. A preferred "thinning" method according to the invention is described in detail below.

The electron in the excited state can be easily pushed from the bound-to-quasibound state into the continuum. An important advantage is that the photoexcited electrons can escape from the quantum well to the continuum transport states with little or no tunneling. This allows reduction of the bias required to efficiently collect the photoelectrons and hence reduces the dark current. Moreover, since the photoelectrons do not have to tunnel through thick barriers, the $Al_xGa_{1-x}As$ barrier thickness of the bound-to-continuum QWIP can be increased without correspondingly reducing photoelectron collection efficiencies. This embodiment uses a barrier width which is preferably between 500 to 600 Å and the quantum well width which is preferably between 40 to 70 Å. This is an increase of five over many conventional QWIPs.

Figure 6:
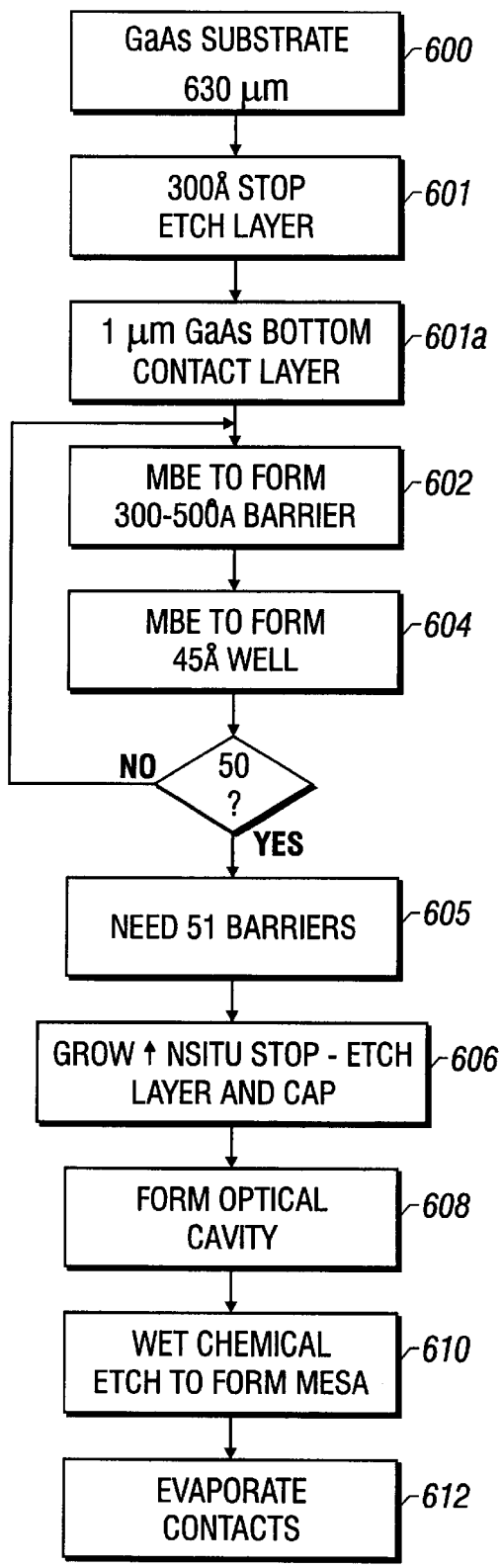
FIG. 6 shows a flow diagram of the process for forming the QWIP of an embodiment.
Figure 7:
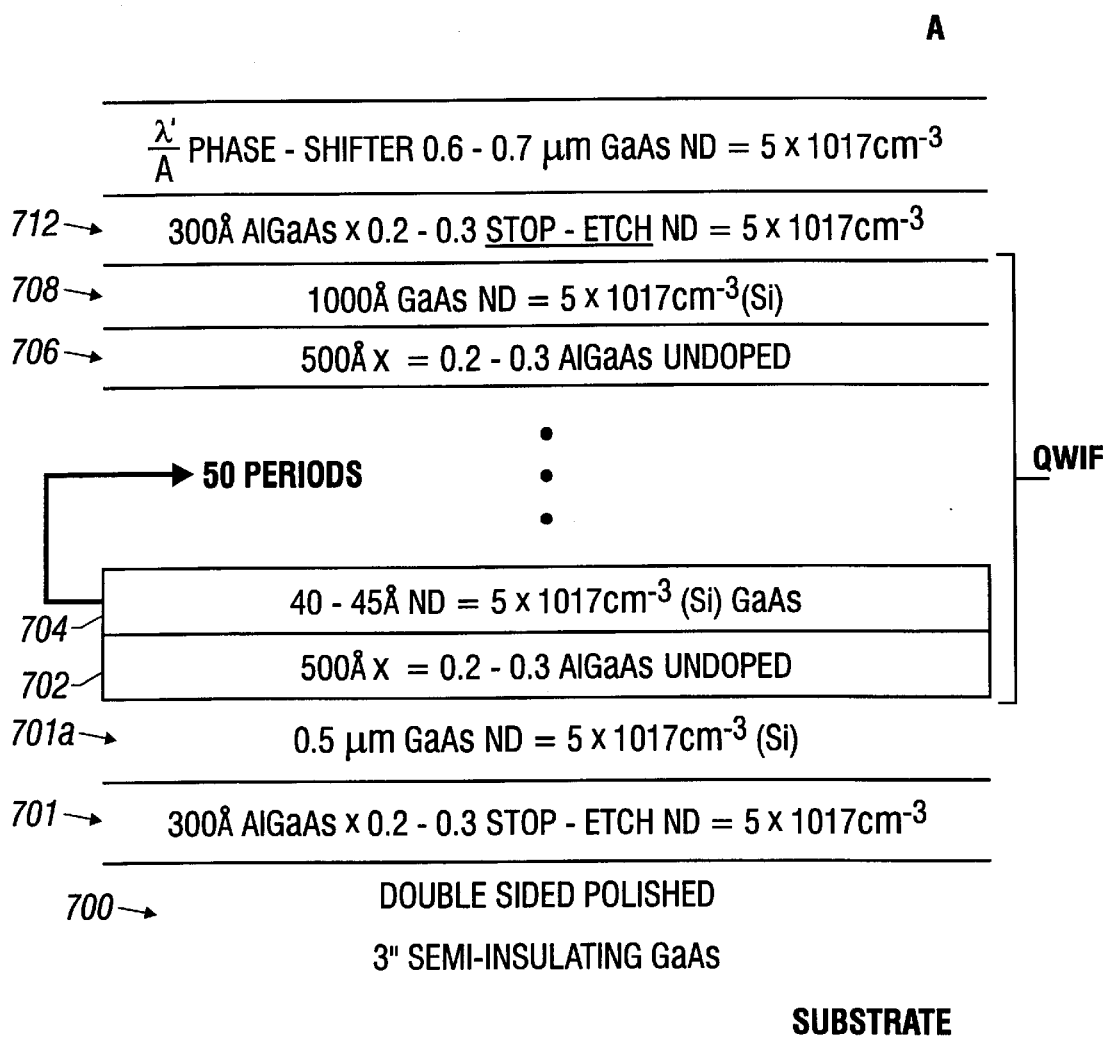
FIG. 7 shows a layer diagram of the QWIP formed employing the flow diagram of FIG. 6.

A second embodiment of the invention is formed as described herein with reference to FIG. 6 to form the layered structure shown in FIG. 7. At step 600, a GaAs substrate of 630 µm is formed. This substrate is shown in FIG. 7 as substrate 700. The GaAs substrate 700 is preferable semi-insulating by virtue of being doped to $N=5\times10^{17}$ $cm^3$. Stop etch layer 701 of 300 Å is also formed at step 601, covered by a 0.5 µm contact layer 701a formed at step 601a.

At step 602, molecular beam epitaxy ("MBE") is used to form first a 500 Å barrier layer of $Al_{0.3}Ga_{0.7}As$ layer 702 on the GaAs bottom contact layer 700. The layer 702 preferably has a thickness of 300–500 Å. This is followed by step 604 in which molecular beam epitaxy is used to form a 45 Å well 704 of GaAs. This process continues until 50 periods are formed. Each period so formed includes both a barrier and a well. One more barrier of undoped $Al_xGa_{1-x}As$ needs to be formed at step 605. Top contact layer 708 of GaAs is between 0.1–0.5 µm thick and appropriately doped.

The entire device may then be covered by another 300 Å stop-etch layer 712 which is grown in situ on top of the device structure. This stop-etch layer 712 is formed of $Al_{0.3}Ga_{0.7}As$. The stop-etch layer 712 is then covered by a 0.7 micron thick GaAs cap layer acting as a λ/4 phase shift layer. The stop-etch layer and cap together form the light coupling optical cavity.

Figure 7A:
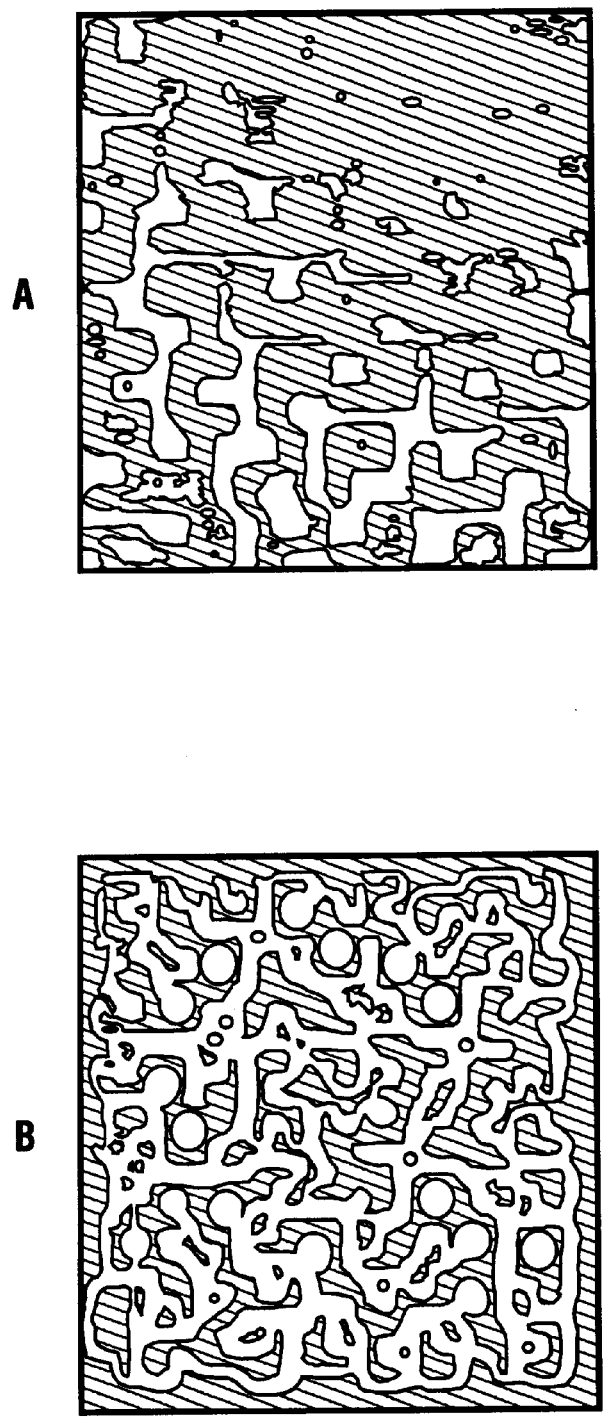
FIG. 7A shows pictures of the random reflectors which are preferably used according to this invention.

At this point the structure is processed into a mesa area using wet chemical etching at step 610. Gold/germanium contacts are evaporated onto the top and bottom contact layer at step 612. Submicron photolithography is used to form random reflectors as described herein and as shown in FIG. 7A.

The resulting device is a 256×256 QWIP focal plane array ("FPA"). The FPA has a 38 micron pitch with an actual pixel size of 28×28 square microns. Random reflectors are formed on top of the detectors and are covered with gold/germanium and gold for ohmic contact and reflection. Indium bumps are evaporated on top of the reflectors for readout circuit hybridization.

Figure 8:
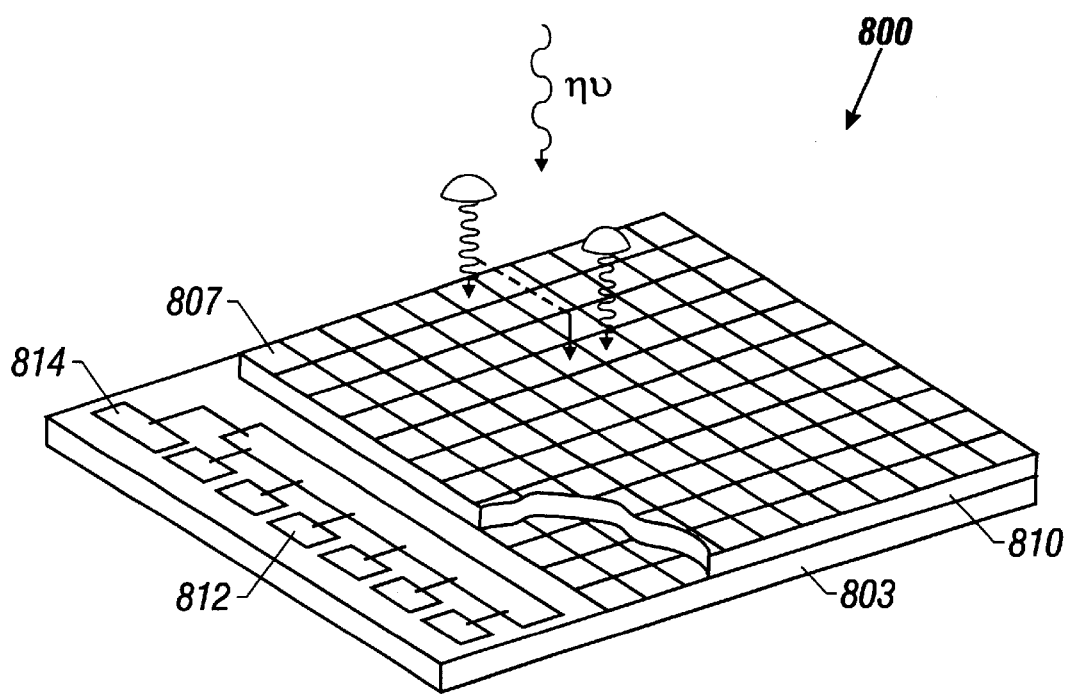
FIG. 8 shows a QWIP array.

FIG. 8 shows a two-dimensional QWIP/silicon CMOS multiplexer hybrid detector 800 for generating two-dimensional infrared images. The hybrid detector 800 has a two-dimensional QWIP array 803 electrically connected to a two-dimensional CMOS multiplexer substrate 810. Both the QWIP array 803 and CMOS multiplexer substrate 810 have a 256×256 array of pixels. Each pixel 807 has a single QWIP similar to that described above. A gold, roughened, random reflecting surface such as discussed in respect to FIG. 7 is formed on the top of the detectors to facilitate absorption of normally incident radiation. Each pixel within the QWIP array 803 is attached to a matching pixel in the CMOS multiplexer substrate 810 by an indium bump.

Figure 9:
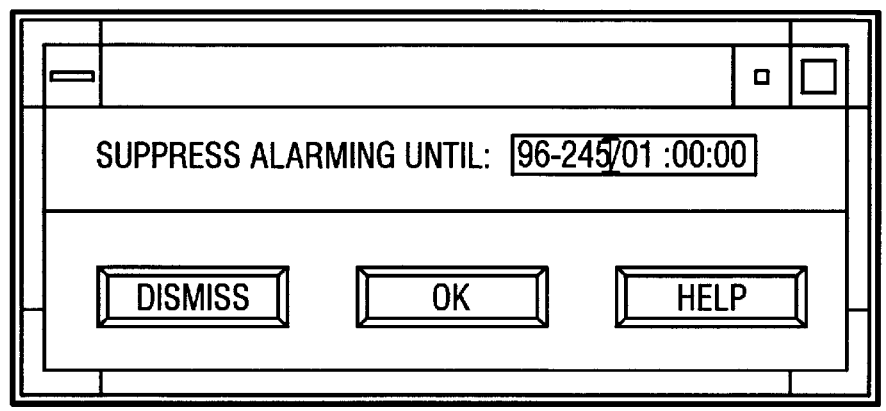
FIG. 9 shows a cross section of the QWIP array along the line 9—9 in FIG. 8.

FIG. 9 is a cross sectional side view of a single pixel 107 of the hybrid detector 100 of FIG. 8. A single QWIP 900 within the pixel has a quantum well structure and electrical contact layers grown on top of a GaAs substrate. A roughened, random reflecting layer 902 is attached to the bottom surface of the QWIP 900 after the GaAs substrate is thinned (described below). The QWIP 900 and reflecting layer 902 are attached via an indium bump 904 to underlying CMOS circuitry 906. The CMOS circuitry 906 is attached to a portion of a silicon substrate 910. Together, the CMOS circuitry 906 and portion of the silicon substrate 910 represent a single pixel 120 of the CMOS multiplexer. This pixel 920 is spatially aligned with the QWIP 900 so that photocurrent generated by the quantum well structure can be detected and processed to form a two-dimensional image.

Figure 10:
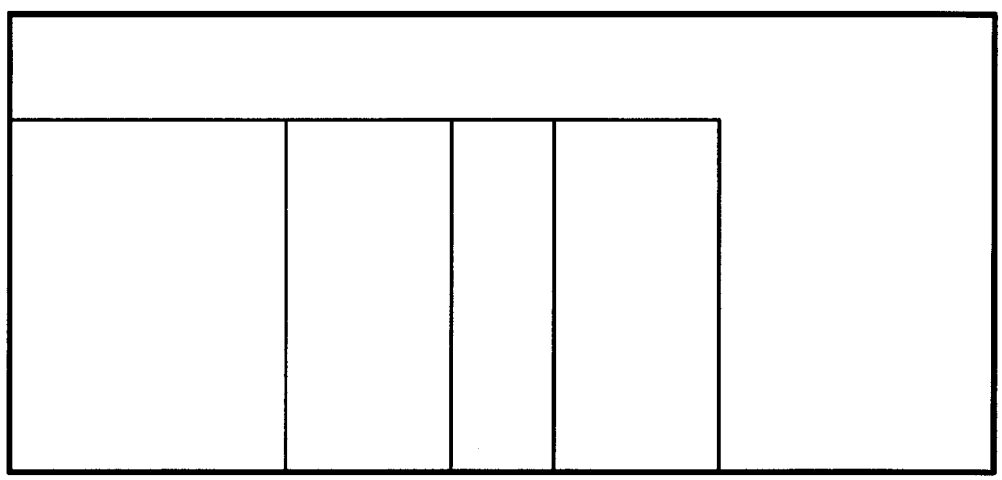
FIG. 10 shows a plan view of multiple pixels of the QWIP array.

FIG. 10 is a drawing of the bottom surfaces of twelve pixels of a camera. This shows the random, roughened reflecting layers 114. Individual pixels have an area of 28 µm×28 µm. The center-to-center separation distance between the pixels is 38 µm.

As described above, random reflectors have demonstrated excellent optical coupling for individual QWIPs. However, the light coupling efficiency of such a random reflector is independent of wavelength because of the random nature of the reflector. The random reflectors essentially exhibit a wideband spectral response.

The inventors have recognized that since an optical coupling mechanism is necessary, there are times at which it may be desirable to filter the passband of the light using the optical coupling mechanism.

The embodiment of FIG. 10 employs a special cross-grating in which the coupling efficiency is wavelength-dependent due to the periodicity of the cross-gratings. This cross-grating light technique enables a narrow-bandwidth high-efficiency QWIP focal plane array.

Figure 10A:
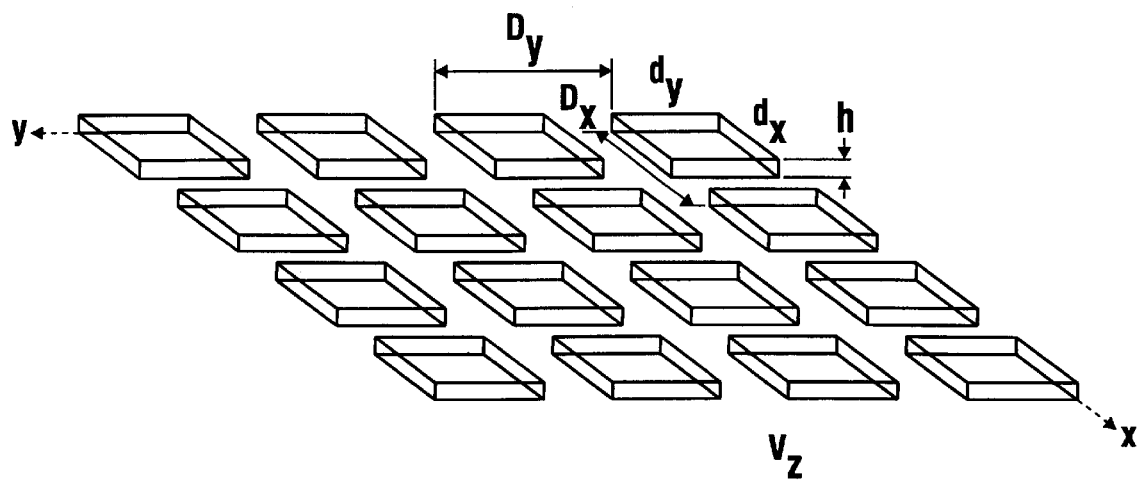
FIG. 10A shows a preferred grating structure of an embodiment.
Figure 10B:
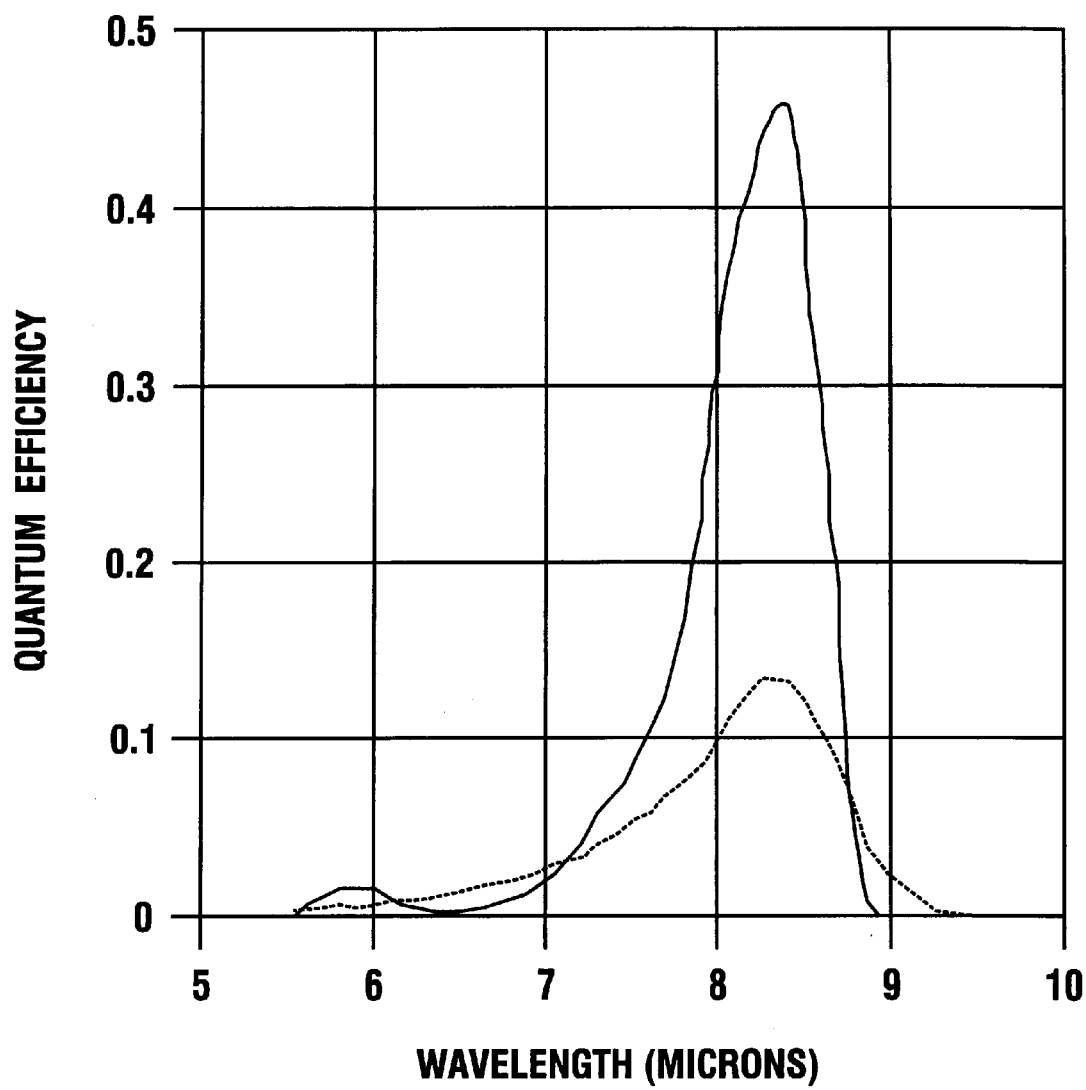
FIG. 10B shows the frequency response of the grating structure of FIG. 10A.

FIG. 10A shows a detailed view of the grating structure, and FIG. 10B shows the quantum efficiency of this grating. Note that this grating has a strong peak wavelength at 8.5 µm. The optimized grating parameters for any grating can be obtained from trial and error, or by calculating the wave amplitudes of the electric and magnetic field vectors between the boundary z=0 plane.

The bound-to-quasibound quantum well structures described above are fabricated by growing alternating GaAs and $Al_xGa_{1-x}As$ layers on a 3-inch GaAs wafer. Each layer is grown using molecular beam epitaxy ("MBE") according to standard, well-known techniques in the art. A doped stop-etch layer is grown on the wafer prior to growing the QWIP. Additional layers are then evaporated on the bottom electrical contact layer and patterned using photolithography and selective dry etching. Photolithography and wet chemical etching are then used to pattern the two-dimensional QWIP array.

The GaAs wafer is diced to form individual GaAs substrates, each containing a two-dimensional QWIP array. The patterned surface of the GaAs substrate is attached to the CMOS multiplexer using an indium bump.

It is usually desirable to minimize pixel-to-pixel crosstalk and thermal mismatches between the focal plane array and the readout multiplexer while maximizing light coupling efficiency. The inventors have used a technique herein called thinning. The technique of this embodiment preferably thins the QWIP focal plane array virtually to the thickness of a membrane. The thin membranes which remain have very small thermal mass that functions to significantly reduce or avoid thermal mismatch. Thinning to the membrane level also maximizes the width to height aspect ratio. This maximizes coupling efficiency from random reflectors. The minimal substrate that remains after the thinning typically attenuates pixel cross-talk.

An important feature of the thinning process of the present invention is growing the whole QWIP device on top of a 300 Å $Al_{0.3}Ga_{0.7}As$ layer. $CCl_2F_2$ selective dry etching is used to remove the last few microns of the GaAs substrate from the QWIP devices. The entire process employs thinning by mechanical polishing followed by non-selective wet etching and selective dry etching.

Gaps between the QWIP array and the multiplexer substrate are filled with an epoxy to solidify the hybrid detector. The connected pixels are also electrically connected to row and column-processing electronics 812 and image-processing electronics 114 situated on the hybrid detector 100.

Figure 11:
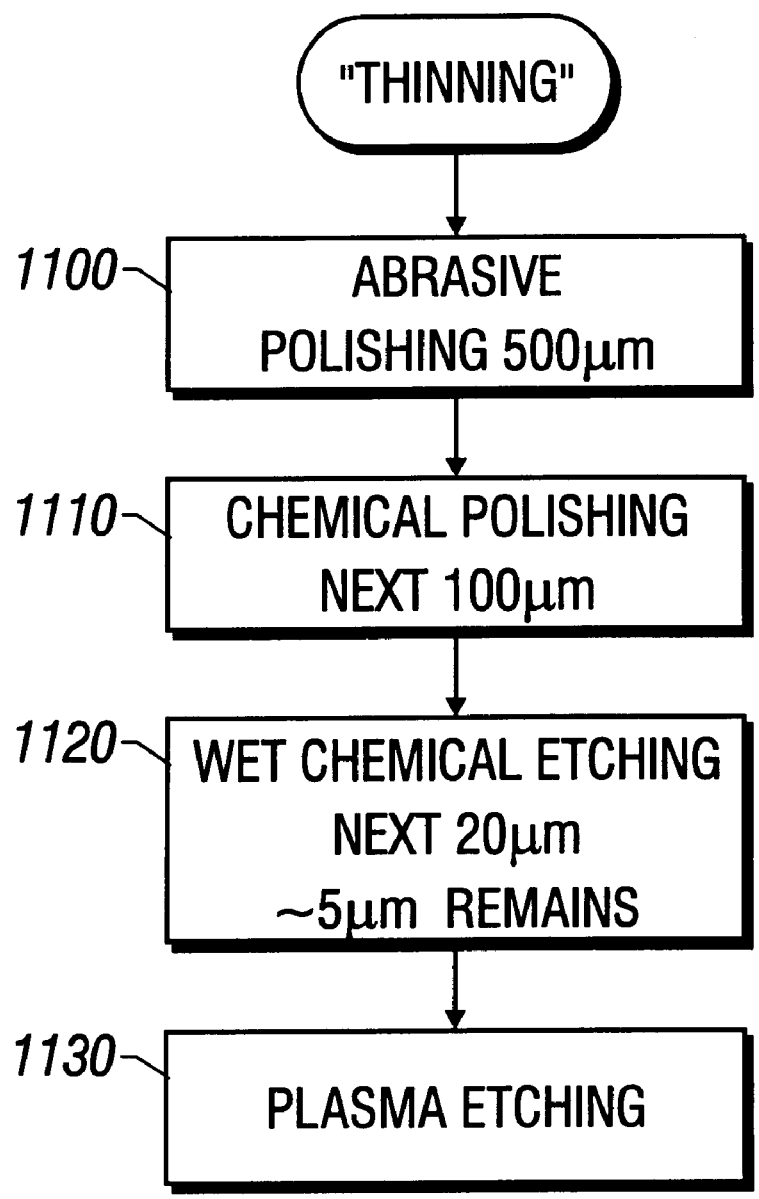
FIG. 11 shows a flowchart of the thinning process preferably used.

FIG. 11 shows a flowchart diagraming the details of the thinning process. Abrasive polishing 1100 is used to remove the first 500 μm of the substrate. The polishing can be done by attaching the CMOS chip to a glass microscope slide and rubbing the GaAs substrate against an abrasive plate treated with $Al_2O_3$ and water.

A chemical polishing process 1110 removes the next 100 μm from the GaAs substrate. This process includes exposing the substrate to a bromine:methanol solution present in a ratio of 1:100.

Wet chemical etching 1120 is then used to remove the next 20 μm from the substrate. In this step, all outer surfaces of the QWIP photodetector except for the GaAs substrate surface are covered with a standard photoresist. The substrate surface is then exposed to an $H_2SO_4$:$H_2O_2$:$H_2O$ solution (5:40:100). The etch rate using this solution is approximately 1.7 to 1.8 μm/minute.

The wet chemical etching 160 is continued until about 5 μm of the GaAs substrate remains. The detector is then dipped into a 5% HCl/deionized water solution for about thirty seconds, blown dry, and loaded into a plasma etching chamber. This plasma etching 1130 is used to remove the substrate at a rate of approximately 1.2 μm/minute until the stop-etch layer is reached. Plasma etching 160 requires evacuating the chamber to a pressure of about $1 \times 10^{-6}$ torr. $CCl_2F_2$ is then introduced into the chamber until the pressure reaches 100 torr. The substrate is biased at 100 W and 45V in the chamber. The substrate is removed from the chamber when the stop-etch layer is reached. Residual materials present on the substrate are easily removed with an $O_2$ plasma.

This leaves about 300 Å of the stop-etch layer and about 1000 Å of the contact layer. This 1300 Å layer has almost no thermal mass, and hence even if cooled to 70° K. permits very little thermal mismatch. This thin layer also improves the optical coupling efficiency and prevents crosstalk as described above.

Another aspect of present invention is the reduction of the fundamental bulk dark current. The fundamental dark current of the QWIP is proportional to the area of the device. This compares with the surface leakage current which is proportional to the circumference. The surface leakage current to bulk dark current ratio therefore increases with decreasing detector size. The surface leakage current contribution into the total noise current of the detector of a large area focal plane is high—e.g. 400% in a typical QWIP.

The present invention reduces the surface leakage current by a special method described herein. As described above, the fundamental dark current of the QWIPs is due to sequential tunneling, thermionic assisted tunneling, and thermionic emission. At higher operating temperatures (i.e., T 50° K. for 10 μm device) thermionic emission dominates the dark current.

Infrared detectors in focal plane arrays are typically around 40×40 $\mu m^2$. The surface current to total dark current ratio for a 40×40 $\mu m^2$ QWIP device can be estimated as around 400%. This tremendous increase in the surface current contribution to the total dark current of a small area device is due to the surface area reduction being much more rapid than the circumference reduction of the device.

The parasitic surface-induced leakage can be reduced significantly by treating the open surfaces with classes of inorganic sulfides as $LiS_2$, $(NH_4)$ S, $Na_2S.9H_2O$, etc. or using $NH_4OH$ wet chemical etch to define the mesa and passivating the open areas with SiN. Therefore, $NH_4OH$ base etchant to define the QWIP mesas and SiN passivation has previously increased the QWIP dark current. This reduction in dark current increases the sensitivity of the QWIP focal plane arrays by 200%.

Other Embodiments

Other embodiments are within the scope of the invention. Importantly, the present specification has described operation with the photocarriers being electrons. The operation could also work analogously with holes forming the photocarriers.

Semiconducting materials other than GaAs and $Al_xGa_{1-x}$ As can also be used to fabricate bound-to-quasibound quantum well structures. Such structures can include, for example, $In_yAl_{1-y}As/In_xGa_{1-x}As/In_yAl_{1-y}As$, $InP/In_xGa_{1-x}As/InP$, $InP/InGaAsP/InP$, $Ga_xIn_{1-x}P/GaAs/Ga_xIn_{1-x}P$, $Al_xIn_{1-x}P/GaAs/Al_xIn_{1-x}P$, and $GaAs/In_xGa_{1-x}As/GaAs$ materials. In all cases, the quantum well parameters (i.e., well depth and width) are varied by adjusting the stoichiometric ratios and thicknesses of the materials so that a bound-to-quasibound energy level configuration exists.

The GaAs and $Al_xGa_{1-x}As$ QWIP described above has a sensitivity peaked at 8.5 μm in the infrared spectral region. It is also possible to fabricate bound-to-quasibound quantum well structures which absorb photons in different regions of the infrared spectrum. For example, the materials used in the quantum well and barrier layers can be, respectively, $Al_yGa_{1-y}As$ and $Al_zGa_{1-z}As$. The mole fractions of Al (i.e., y and z) are then adjusted to form the bound-to-quasibound quantum well structure having the desired well depth. The thickness of the GaAs well layer can also be changed to achieve a different spectral response.

Different quantum wells within a single QWIP can also have different absorptive properties. This effectively broadens the spectral response of the QWIP and makes for a more robust detector. In one embodiment, barrier layers of $Al_xGa_{1-x}As$ separate alternating layers of GaAs and $Al_yGa_{1-y}$ As. Quantum wells defined by $Al_xGa_{1-x}As$:$Al_yGa_{1-y}$ As:$Al_xGa_{1-x}As$ where x is 0.3 have bound-to-quasibound energy levels and absorb radiation at a first wavelength (i.e., 10.5 microns). Quantum wells defined by $Al_xGa_{1-x}$ As:GaAs:$Al_xGa_{1-x}As$ where x is 0.3 absorb radiation at a second wavelength (i.e., 8.5 microns). The distribution of these quantum wells within the quantum well structure can be either random or periodic. Alternatively, absorption in different spectral regions is achieved with quantum well structures having individual quantum wells made from the different types of materials described above.

In addition, other materials in the QWIP, such as the electrical contact, reflecting, and stop-etch layers, can be substituted for or doped differently to achieve a similar electrical function. For example, the random reflecting layer used to generate angled, internal reflections within the quantum well structure can be replaced by diffraction gratings or similar optical structures which diffract or reflect radiation. Diffraction gratings are desirable in some applications, as they exhibit wavelength-dependent diffraction. These structures can therefore be used to narrow the spectral response of the QWIP.

Other embodiments of the thinning process can also be used to fabricate the QWIP. For example, the steps of the method can be varied to remove amounts of the substrate other than those described above. Similarly, the chemicals used for the wet and plasma etching processes can be substituted with other suitable chemicals.

What is claimed is:

1. A quantum well infrared photodetector, comprising:
    a plurality of periods, each period having a barrier layer and a well layer, each well layer of each period coupled between two barrier layers,
    each well having a well bottom, and a well top, and each well supporting bound energy states therein,
    each of said plurality of periods being selected such that a bound energy state is substantially resonant with said well top.

2. A photodetector as in claim 1, wherein said wells are formed of GaAs.

3. A photodetector as in claim 2, wherein said barrier layers are formed of $Al_xGa_{1-x}As$.

4. A photodetector as in claim 3, wherein x is substantially 0.3.

5. A photodetector as in claim 1, wherein the materials forming the wells are an order of magnitude thinner than the material forming the barriers.

6. A photodetector as in claim 1, wherein said well layers are formed of GaAs which are 45 Å thick surrounded by $Al_xGa_{1-x}As$ barrier layers which are 500 Å thick, and wherein x is a mole fraction of preferably 0.3.

7. A quantum well photodetector, comprising:
    a radiation detecting surface;
    a photodetector element, having
    a plurality of periods, each period having a barrier layer of a first semiconductor material and a well layer of a second semiconductor material, said first and second materials defining a band gap therebetween, each well layer of each period coupled between two barrier layers, each well having a well bottom, and a well top, and each well supporting an unexcited energy state for photocarriers, and a bound excited energy state for photocarriers, said photocarriers excited by radiation into said bound excited energy state,
    each of said plurality of said periods being selected such that a bound energy state is substantially resonant with said well top.

8. A quantum well semiconductor, comprising:
    a plurality of quantum well structures, each said quantum well structure having a barrier layer of a first semiconductor material and a well layer of a second semiconductor material, said first and second materials defining a band gap therebetween, each well layer of each period coupled between two barrier layers, each well having a well bottom, and a well top, and each well supporting an unexcited energy state, and a bound excited energy state for photocarriers,
    each of said plurality of said wells being selected such that the bound excited energy state is substantially resonant with a top portion of the well.

9. A semiconductor as in claim 8, wherein said bound energy state is at a position such that bound excited carriers can escape from said bound excited state into the continuum by tunneling through less than 50 Å of material.

10. A semiconductor as in claim 8, wherein said bound energy state is at a position such that an energy barrier of the quantum well is matched to an energy required for photo-ionization with a difference of less than 2%.

11. A bound-to-quasibound quantum well semiconductor comprising:
    a well layer comprising a first semiconducting material, said well layer having a first abutting surface and a second abutting surface; and
    first and second barrier layers, each comprising a second semiconducting material different than the first semiconducting material, said first barrier layer having a first surface that is attached to said first abutting surface of said well layer, and said second barrier layer having a first surface that is attached to said second abutting surface of said well layer,
    each of said plurality of layers selected to have an excited-state energy level which is substantially the same energy as an energy level that defines a top of the quantum well.

12. A method for reducing the thickness of a substrate attached to a quantum well, comprising:
    growing a stop-etch layer on a top surface of the substrate;
    growing the quantum well on the stop-etch layer;
    removing a first layer from a bottom surface of the substrate with an abrasive polishing solution;
    removing a second layer from the bottom surface of the substrate with a chemical polishing solution;
    removing a third layer from the bottom surface of the substrate with a wet chemical etching solution; and,
    removing more of the substrate with a plasma etching process.

13. A photodetector as in claim 1 wherein said each of said plurality of periods have a bound energy state within 2 to 5 percent of said well top.

14. A photodetector as in claim 1 wherein each of said plurality of periods have a bound energy state within 2 to 3 millielectron volts of said well top.

15. A photodetector as in claim 1 wherein the bound energy state for each of said plurality of periods is such that an excited photocarrier needs to tunnel through less than 80 angstroms of the well.

16. A photodetector as in claim 15 wherein the bound energy state of each of said plurality of periods is such that the excited photocarrier needs to tunnel through less than 38 angstroms of the well.

17. A photodetector as in claim 1 further comprising a facet which causes optical radiation to be incident on the well at an angle other than normal to its surface.

18. A photodetector as in claim 7 wherein said each of said plurality of periods have a bound energy state within 2 to 5 percent of said well top.

19. A photodetector as in claim 7 wherein each of said plurality of periods have a bound energy state within 2 to 3 millielectron volts of said well top.

20. A photodetector as in claim 7 wherein the bound energy state of each of said plurality of periods is such that an excited photocarrier needs to tunnel through less than 80 angstroms of the well.

21. A photodetector as in claim 7 wherein the bound energy state of each of said plurality of periods is such that the excited photocarrier needs to tunnel through less than 38 angstroms of the well.

22. A photodetector as in claim 7 further comprising a facet which causes optical radiation to be incident on the well at an angle other than normal to its surface.

23. A semiconductor as in claim 8 wherein said each of said plurality of periods have a bound energy state within 2 to 5 percent of the well top.

24. A semiconductor as in claim 8 wherein each of said plurality of periods have a bound energy state within 2 to 3 millielectron volts of said well top.

25. A semiconductor as in claim 8 wherein the bound energy state for each of said plurality of periods is such that an excited photocarrier needs to tunnel through less than 80 angstroms of the well.

26. A semiconductor as in claim 8 wherein the bound energy state for each of said plurality of periods is such that the excited photocarrier needs to tunnel through less than 38 angstroms of the well.

27. A semiconductor as in claim 8 further comprising a facet which causes optical radiation to be incident on the well at an angle other than normal to its surface.

28. A semiconductor as in claim 11 wherein said each of said plurality of periods have a bound energy state within 2 to 5 percent of the top of the well.

29. A semiconductor as in claim 11 wherein each of said plurality of periods have a bound energy state within 2 to 3 millielectron volts of the top of the well.

30. A semiconductor as in claim 11 wherein the bound energy state of each of said plurality of periods is such that an excited photocarrier needs to tunnel through less than 80 angstroms of the well.

31. A semiconductor as in claim 11 wherein the bound energy state of each of said plurality of periods is such that the excited photocarrier needs to tunnel through less than 38 angstroms of the well.

32. A semiconductor as in claim 11 further comprising a facet which causes optical radiation to be incident on the well at an angle other than normal to its surface.

* * * * *